(12) United States Patent
Hino et al.

(10) Patent No.: US 11,508,840 B2
(45) Date of Patent: Nov. 22, 2022

(54) SILICON CARBIDE SEMICONDUCTOR DEVICE AND POWER CONVERTER

(71) Applicant: Mitsubishi Electric Corporation, Tokyo (JP)

(72) Inventors: Shiro Hino, Tokyo (JP); Yuichi Nagahisa, Tokyo (JP); Koji Sadamatsu, Tokyo (JP); Hideyuki Hatta, Tokyo (JP); Kotaro Kawahara, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 195 days.

(21) Appl. No.: 16/885,319

(22) Filed: May 28, 2020

(65) Prior Publication Data

US 2020/0321462 A1 Oct. 8, 2020

Related U.S. Application Data

(63) Continuation of application No. PCT/JP2018/046591, filed on Dec. 18, 2018.

(30) Foreign Application Priority Data

Dec. 19, 2017 (JP) .............................. JP2017-242642

(51) Int. Cl.
*H01L 29/78* (2006.01)
*H01L 29/06* (2006.01)
(Continued)

(52) U.S. Cl.
CPC ...... *H01L 29/7806* (2013.01); *H01L 29/0623* (2013.01); *H01L 29/0638* (2013.01);
(Continued)

(58) Field of Classification Search
CPC ............. H01L 29/7806; H01L 29/0623; H01L 29/0638; H01L 29/1095; H01L 29/1608;
(Continued)

(56) References Cited

U.S. PATENT DOCUMENTS

2012/0286290 A1 11/2012 Uchida
2014/0231828 A1* 8/2014 Horikawa ........... H01L 21/8213
257/77

(Continued)

FOREIGN PATENT DOCUMENTS

JP 2003-017701 A 1/2003
JP 2012-216705 A 11/2012
(Continued)

OTHER PUBLICATIONS

U.S. Appl. No. 16/757,767, filed Apr. 21, 2020 is a co-pending related application to the present application.
(Continued)

*Primary Examiner* — Shahed Ahmed
(74) *Attorney, Agent, or Firm* — Xsensus LLP

(57) ABSTRACT

In SiC-MOSFETs including Schottky diodes, passage of a bipolar current to a second well region formed in a terminal portion sometimes reduces a breakdown voltage. In a SiC-MOSFET including Schottky diodes according to the present invention, the second well region formed in the terminal portion has a non-ohmic connection to a source electrode, and a field limiting layer lower in impurity concentration than the second well region is formed in a surface layer area of the second well region which is a region facing a gate electrode through a gate insulating film.

21 Claims, 14 Drawing Sheets

(51) Int. Cl.
   *H01L 29/10* (2006.01)
   *H01L 29/16* (2006.01)
   *H02P 27/08* (2006.01)

(52) U.S. Cl.
   CPC ...... *H01L 29/1095* (2013.01); *H01L 29/1608* (2013.01); *H01L 29/7811* (2013.01); *H02P 27/08* (2013.01)

(58) Field of Classification Search
   CPC ............. H01L 29/7811; H01L 29/0696; H01L 29/66068; H01L 29/872; H01L 29/7801–7826; H01L 29/04–045; H02P 27/08
   See application file for complete search history.

(56) References Cited

U.S. PATENT DOCUMENTS

| | | |
|---|---|---|
| 2014/0252378 A1 | 9/2014 | Ota et al. |
| 2015/0236012 A1 | 8/2015 | Hino et al. |
| 2016/0079411 A1* | 3/2016 | Hino ................... H01L 29/0865 257/77 |
| 2019/0181259 A1 | 6/2019 | Hino et al. |
| 2019/0371935 A1 | 12/2019 | Hatta et al. |
| 2019/0371936 A1 | 12/2019 | Nagahisa et al. |

FOREIGN PATENT DOCUMENTS

| | | |
|---|---|---|
| JP | 2014-045211 A | 3/2014 |
| JP | 2014-175412 A | 9/2014 |
| WO | 2012/056705 A1 | 5/2012 |
| WO | 2014/038110 A1 | 3/2014 |
| WO | 2014/162969 A1 | 10/2014 |
| WO | 2017/179102 A1 | 10/2017 |
| WO | 2018/155553 A1 | 8/2018 |
| WO | 2018/155566 A1 | 8/2018 |

OTHER PUBLICATIONS

U.S. Appl. No. 16/759,731, filed Apr. 28, 2020 is a co-pending related application to the present application.
International Search Report and Written Opinion dated Apr. 2, 2019 for PCT/JP2018/046591 filed on Dec. 18, 2018, 9 pages including English Translation of the International Search Report.
International Search Report and Written Opinion dated Mar. 26, 2019 for PCT/JP2018/046575 filed on Dec. 18, 2018, 11 pages including English Translation of the International Search Report.
International Search Report and Written Opinion dated Nov. 20, 2018 for PCT/JP2018/031165 filed on Aug. 23, 2018, 10 pages including English Translation of the International Search Report.
Office Action dated Mar. 2, 2021, in corresponding Japanese patent Application No. 2020-077214, 11 pages.

* cited by examiner

US 11,508,840 B2

SILICON CARBIDE SEMICONDUCTOR DEVICE AND POWER CONVERTER

CROSS-REFERENCE TO RELATED APPLICATIONS

The present application is a bypass continuation of PCT filing PCT/JP2018/046591, filed Dec. 18, 2018, which claims priority to JP 2017-242642, filed Dec. 19, 2017, the entire contents of each are incorporated herein by reference.

TECHNICAL FIELD

The present invention relates to a silicon carbide semiconductor device made of silicon carbide and to a power converter.

BACKGROUND ART

It is known that continuously passing a forward current, specifically, a bipolar current through a p-n diode made of silicon carbide (SiC) creates a problem in the reliability, that is, stacking faults in crystals which cause a forward voltage to shift. This probably occurs due to expansion of the stacking faults, specifically, plane defects with recombination energy obtained when minority carriers implanted through the p-n diode are recombined with majority carriers. The expansion originates from, for example, a basal plane dislocation in a silicon carbide substrate. The stacking faults obstruct the current flow. Hence, the expansion of the stacking faults reduces the current and increases the forward voltage, thus causing reduction in the reliability of a semiconductor device.

Such increase in the forward voltage also occurs in vertical metal oxide semiconductor field effect transistors (MOSFETs) made of silicon carbide. The vertical MOSFETs include a parasitic p-n diode (body diode) between a source and a drain. When the forward current flows through this body diode, the vertical MOSFETs also suffer from the reduction in the reliability, similarly to the p-n diode. When a body diode of a SiC-MOSFET is used as a free-wheeling diode of a MOSFET, the characteristics of this MOSFET may be degraded.

One method for solving the problem in the reliability due to the passage of the forward current through the parasitic p-n diode is to apply stress for passing a forward current through the parasitic p-n diode for a long time, measure changes between a forward voltage before the stress application and a forward voltage after the stress application, and eliminate (screen out) an element with large change in the forward voltage from products as described in Japanese Patent Application Laid-Open No. 2014-175412. However, this method has disadvantages of prolonging the duration of current passage and producing many defective items by using wafers with many defects. Another method is to incorporate and use, in a semiconductor device as a unipolar transistor such as a MOSFET, unipolar diodes as free-wheeling diodes. For example, Japanese Patent Application Laid-Open No. 2003-017701 and WO2014/038110 each describe a method for incorporating Schottky barrier diodes (SBD) as unipolar diodes into a unit cell of a MOSFET.

When such a unipolar transistor including, in an active region, unipolar diodes, specifically, diodes in which a current is passed through only majority carriers is applied as an SiC semiconductor device, no bipolar current flows through the body diodes during a free-wheeling operation by designing a diffusion potential of the unipolar diodes, specifically, a voltage for starting current passage to be lower than a diffusion potential at a p-n junction. This can suppress degradation in characteristics of the unipolar transistor in the active region.

Even in the unipolar transistor including the unipolar diodes in the active region, a terminal region, namely, a region other than the active region, however, may have a portion with a parasitic p-n diode where the unipolar diodes are hardly disposed due to its structure.

For example, a region near a gate pad or near a terminal portion of a semiconductor device has a terminal well region protruding toward the periphery more than a source electrode. A parasitic p-n diode is formed between this terminal well region and a drift layer. In this portion, neither a Schottky electrode nor a unipolar diode is formed. Since there is no Schottky electrode in the terminal well region, a voltage between the source electrode and a drain electrode is applied to the p-n diode formed by the terminal well region and the drift layer. As a result, a bipolar current flows through the p-n diode.

When this portion includes, for example, the origin of the basal plane dislocation, the stacking faults may be expanded, which may reduce the breakdown voltage of a transistor. Specifically, a leakage current may occur when the transistor is in an OFF state, and the heat generated from the leakage current may break an element or a circuit.

This problem should be avoided by limiting, to a certain value or less, a voltage to be applied between the source and the drain so that a bipolar current is prevented from flowing through the p-n diode formed by the terminal well region and the drift layer. Therefore, the chip size should be increased to reduce a voltage between the source and the drain which is generated when a free-wheeling current flows. However, this brings disadvantages of increase in the chip size and the cost.

Methods for suppressing a forward operation of the p-n diode formed by the terminal well region and the drift layer without increasing the chip size include a method for increasing the resistance of a current path formed between each portion of the terminal well region and the source electrode. Examples of the method for increasing the resistance of the current path include a method for increasing the contact resistance between the terminal well region and the source electrode (e.g. WO2014/162969). When a bipolar current flows through the p-n diode formed by the terminal well region and the drift layer in such a structure, the resistance component causes a voltage drop. Thus, a difference between a potential of the terminal well region and a source potential is created, and the forward voltage to be applied to the p-n diode is reduced by the difference. Thus, the passage of the bipolar current can be suppressed.

SUMMARY

Problem to be Solved by the Invention

When an electrode having an ohmic connection to a source electrode is formed in a terminal well region, even if the contact resistance between the terminal well region and the source electrode is increased, sometimes, the resistance of the current path formed between the terminal well region and the source electrode cannot be sufficiently increased and the passage of the bipolar current to the terminal well region cannot be sufficiently reduced.

Here, when a gate electrode is formed on a terminal well through an insulating film without an ohmic connection between the terminal well region and a source electrode, a high electric field is applied to the insulating film between the terminal well and the gate electrode, and dielectric breakdown may occur in the insulating film.

The present invention has been conceived to solve the problems, and has an object of providing a more reliable silicon carbide semiconductor device.

Means to Solve the Problem

A silicon carbide semiconductor device according to the present invention includes: a semiconductor substrate made of silicon carbide of a first conductivity type; a drift layer of the first conductivity type, the drift layer being formed on the semiconductor substrate; a plurality of first well regions of a second conductivity type, the first well regions being formed in a surface layer of the drift layer; a first separation region of the first conductivity type, the first separation region being formed adjacent to each of the first well regions from a surface of the first well regions to the drift layer; a source region of the first conductivity type, the source region being formed in a surface layer area of each of the first well regions; a first Schottky electrode formed on the first separation region, the first Schottky electrode forming a Schottky junction with the first separation region; an ohmic electrode formed on each of the first well regions; a second well region of the second conductivity type, the second well region being formed in the surface layer of the drift layer separately from the first well regions; a gate insulating film formed on the first well regions and the second well region; a gate electrode formed on the gate insulating film on the first well regions and the second well region; a gate pad connected to the gate electrode and formed above the second well region; a source electrode electrically connected to the first Schottky electrode and the ohmic electrodes, the source electrode having a non-ohmic connection to the second well region; and a field limiting layer formed in a surface layer area of the second well region that is a portion facing the gate electrode through the gate insulating film, the field limiting layer being lower in impurity concentration of the second conductivity type than the second well region.

Effects of the Invention

In the silicon carbide semiconductor device according to the present invention, a bipolar current can be significantly prevented from flowing through a terminal well region, which can enhance the reliability.

DESCRIPTION OF EMBODIMENTS

Figure 1:
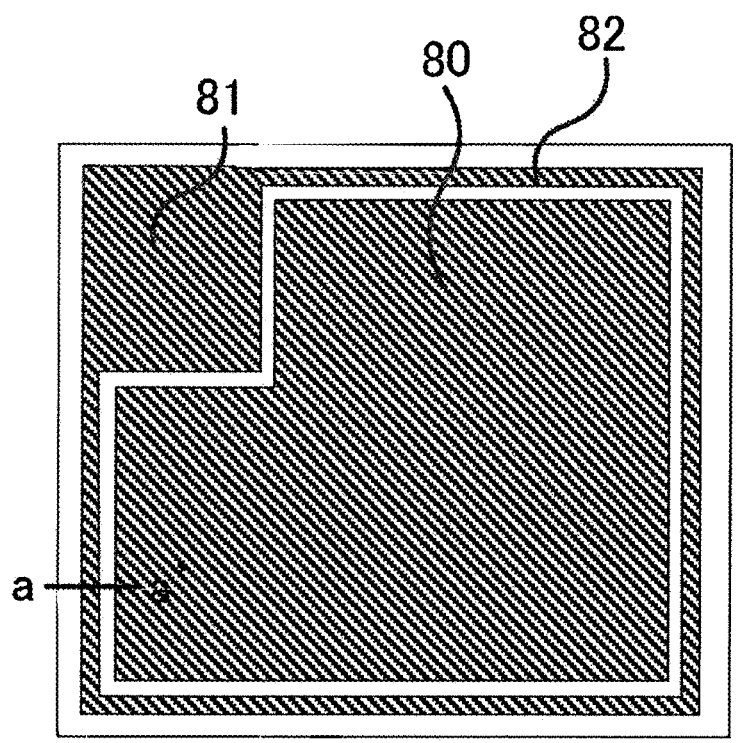
FIG. 1 is a schematic plan view of a silicon carbide semiconductor device according to Embodiment 1 of this invention when viewed from the top surface.

Embodiments will be described below with reference to the accompanying drawings. Since the drawings are schematically illustrated, the mutual relationships in size and position between images in the different drawings are not necessarily accurate but may be changed when needed. In the following description, the same reference numerals are assigned to the same constituent elements, and their names and functions are the same. Thus, the detailed description thereof may be omitted.

Embodiments in the DESCRIPTION will describe n-channel silicon carbide MOSFETs whose first conductivity type is n-type and whose second conductivity type is p-type, as example silicon carbide (SiC) semiconductor devices. A potential level will be described assuming the first conductivity type as n-type and the second conductivity type as p-type. Conversely, if the first conductivity type is p-type and the second conductivity type is n-type, the potential level will be described the other way around.

Furthermore, this application will describe, as a terminal region, a region other than an active region of a semiconductor device where unit cells are periodically arranged.

Embodiment 1

First, a structure of a silicon carbide semiconductor device according to Embodiment 1 of the present invention will be described.

FIG. 1 is a schematic plan view of a silicon carbide MOSFET with built-in Schottky diodes (SBDs) (SiC-MOSFET with built-in SBDs) as the silicon carbide semiconductor device according to Embodiment 1 when viewed from the top surface. In FIG. 1, a gate pad 81 is formed partly in an upper surface of the SiC-MOSFET, and a source electrode 80 is formed adjacent to the gate pad 81. A gate line 82 is formed to extend from the gate pad 81.

Figure 2:
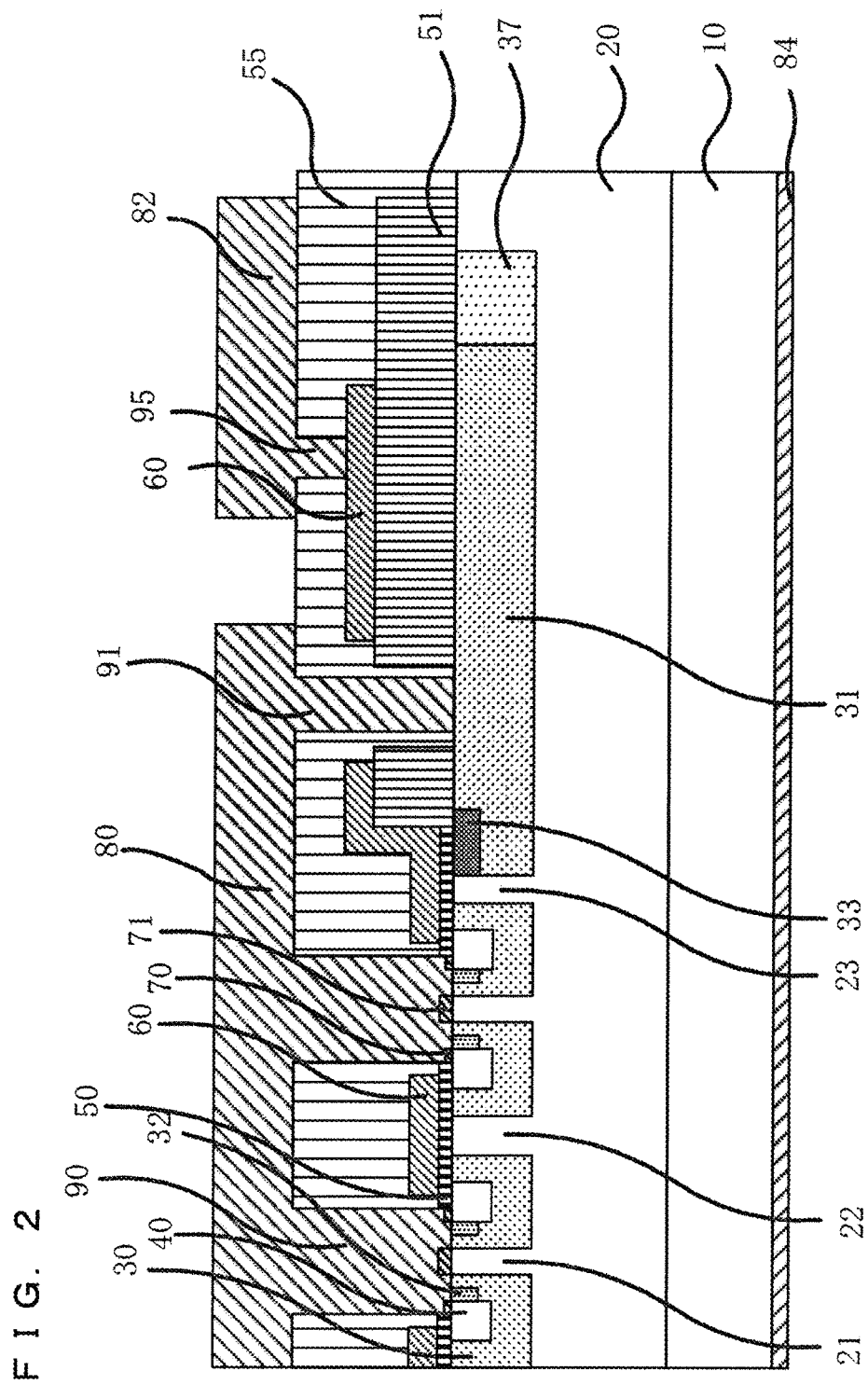
FIG. 2 is a schematic sectional view of the silicon carbide semiconductor device according to Embodiment 1 of this invention.
Figure 3:
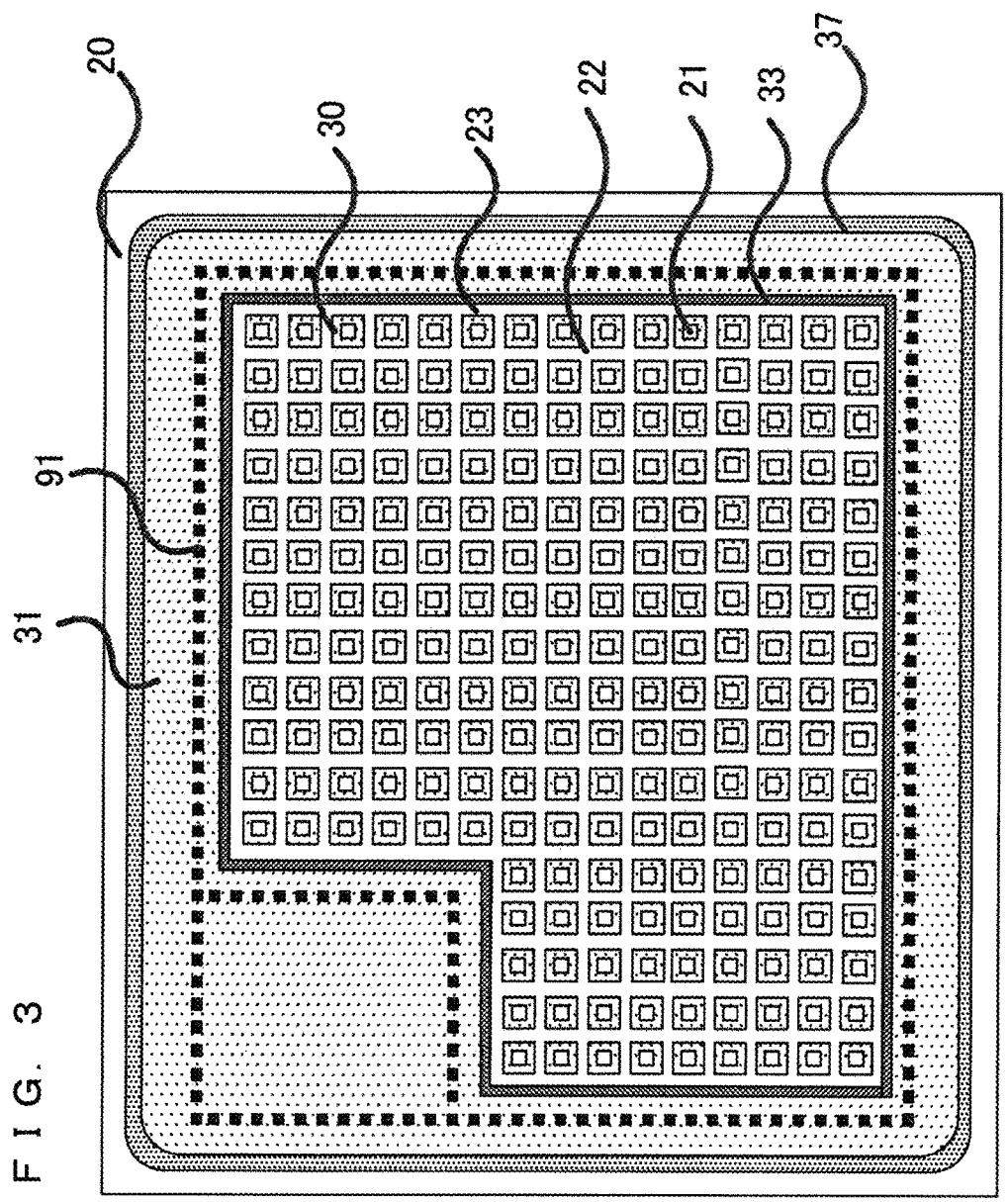
FIG. 3 is a schematic plan view of the silicon carbide semiconductor device according to Embodiment 1 of this invention.

FIG. 2 is a schematic sectional view schematically illustrating a cross section corresponding to the line a-a' from the source electrode 80 to the gate line 82 on the periphery of the silicon carbide semiconductor device in FIG. 1. FIG. 3 is a schematic plan view mainly illustrating a silicon carbide semiconductor portion in the top view of FIG. 1.

In FIG. 2, a drift layer 20 made of n-type silicon carbide is formed on a surface of a semiconductor substrate 10 made of silicon carbide of n-type and low resistance. As shown in FIG. 3, a second well region 31 made of p-type silicon carbide is formed in a surface layer area of the drift layer 20 substantially corresponding in position to a region with the gate line 82 described with reference to FIG. 1.

A plurality of first well regions 30 made of p-type silicon carbide are formed in the surface layer area of the drift layer 20 and under a region with the source electrode 80 described with reference to FIG. 1. In a surface layer area of each of the first well regions 30, a source region 40 made of n-type silicon carbide is formed at a position inner than the periphery of the first well region 30 by a predetermined distance.

A contact region 32 made of silicon carbide of low resistance and p-type is formed in the surface layer area of each of the first well regions 30 which is inner than the source region 40 in the surface layer area of the first well region 30. First separation regions 21 made of silicon carbide and further inner than the contact regions 32 are formed through the first well regions 30. The first separation regions 21 should be formed near the first well regions 30, and may be adjacent to the first well regions 30 without penetrating through the first well regions 30. The first separation regions 21 are of n-type similarly to the drift layer 20, and have the same impurity concentration as that of the drift layer 20.

A first Schottky electrode 71 forming a Schottky connection with each of the first separation regions 21 is formed on a surface of the first separation region 21. Here, the first Schottky electrode 71 is preferably formed to include at least the corresponding first separation region 21 when viewed from the top surface.

An ohmic electrode 70 is formed on a surface of the source region 40. The source electrode 80 to be connected to the ohmic electrodes 70, the first Schottky electrodes 71, and the contact regions 32 is formed on the surface of these. The first well regions 30 can easily exchange electrons and holes with the ohmic electrodes 70 through the contact regions 32 of low resistance.

Regions between the adjacent first well regions 30 in the drift layer 20 are second separation regions 22. The second separation regions 22 are of n-type similarly to the drift layer 20, and have the same impurity concentration as that of the drift layer 20. A gate insulating film 50 is formed on the surface of the adjacent first well regions 30, the second separation regions 22 between the adjacent first well regions 30, and the source regions 40 in the first well regions 30. A gate electrode 60 is formed on the gate insulating film 50 at least on the first well regions 30. The surface layer area of the first well regions 30, which is below a portion where the gate electrode 60 is formed and faces the gate electrode 60 through the gate insulating film 50, will be referred to as a channel region.

The second well region 31 is formed outside the first well regions 30 around the outermost circumference of the silicon carbide semiconductor device. A third separation region 23 is formed between the first well regions 30 and the second well region 31. The third separation region 23 is of n-type similarly to the drift layer 20, and has the same impurity concentration as that of the drift layer 20.

The gate insulating film 50 is formed also on the second well region 31. The gate electrode 60 is formed on the gate insulating film 50. Here, a field limiting layer 33 of the second conductivity type, which is lower in impurity concentration of the second conductivity type than the second well region 31, is formed in a surface layer area of the second well region 31 that is a region facing the gate electrode 60.

An interlayer insulating film 55 is formed between the gate electrode 60 and the source electrode 80. Further, the gate electrode 60 and the gate line 82 above the second well region 31 are connected with each other through gate contact holes 95 formed in the interlayer insulating film 55. A p-type JTE region 37 made of silicon carbide is formed around the periphery of the second well region 31, specifically, on the opposite side of the first well regions 30. The JTE region 37 is lower in impurity concentration than the second well region 31.

A field insulating film 51 thicker than the gate insulating film 50 or the gate insulating film 50 is formed on the second well region 31 and the field limiting layer 33. An opening (second contact hole 91) is formed partly in the gate insulating film 50 or the field insulating film 51 on the surface of the second well region 31. The source electrode 80 connected to, for example, the ohmic electrodes 70 is formed in the opening. Here, the second well region 31 does not have a direct ohmic connection to the source electrode 80, but is insulated from or forms a Schottky connection with the source electrode 80.

In the active region, the source electrode 80 on the ohmic electrodes 70, the first Schottky electrodes 71, and the contact regions 32 is connected to the source electrode 80 on the interlayer insulating film 55 through a first contact hole 90 formed through the interlayer insulating film 55 and the gate insulating film 50.

A drain electrode 84 is formed on a rear surface of the semiconductor substrate 10.

Next, a method for manufacturing the SiC-MOSFET with built-in SBDs as the silicon carbide semiconductor device according to Embodiment 1 will be described.

First, the drift layer 20 made of n-type silicon carbide having an impurity concentration from $1\times10^{15}$ to $1\times10^{17}$ cm$^{-3}$ and having a thickness from 5 to 50 μm is epitaxially grown by chemical vapor deposition (CVD) on the semiconductor substrate 10 whose first main surface in one plane direction is a (0001) plane with an off angle, which has a 4H polytype, and which is made of silicon carbide of n-type and low resistance.

Next, an implantation mask is formed in a predetermined region on the surface of the drift layer 20 using, for example, a photoresist. Then, p-type impurities such as aluminum (Al) are ion-implanted. Here, the depth of the ion-implanted Al approximately ranges from 0.5 to 3 μm, which does not exceed the thickness of the drift layer 20. The impurity concentration of the ion-implanted Al ranges from $1\times10^{17}$ to $1\times10^{19}$ cm$^{-3}$, which is higher than that of the drift layer 20. Then, the implantation mask is removed. With this process, the ion-implanted Al region becomes the first well regions 30 and the second well region 31.

Next, an implantation mask is formed on the surface of the drift layer 20 using, for example, a photoresist. Then, p-type impurities such as Al are ion-implanted. Here, the depth of the ion-implanted Al approximately ranges from 0.5 to 3 μm, which does not exceed the thickness of the drift layer 20. The impurity concentration of the ion-implanted Al ranges from $1\times10^{16}$ to $1\times10^{18}$ cm', which is higher than that of the drift layer 20 and lower than that of the first well regions 30. Then, the implantation mask is removed. With this process, the ion-implanted Al region becomes the JTE region 37. Likewise, ion-implanting Al into a predetermined region with an impurity concentration lower than that of the second well region 31 forms the field limiting layer 33. Here, Al is ion-implanted so that a region deeper than the field limiting layer 33 has the same impurity concentration distribution as that of the second well region 31. Likewise, ion-implanting Al into a predetermined region with an impurity concentration higher than that of the first well regions 30 forms the contact regions 32.

Next, an implantation mask is formed using, for example, a photoresists so that a predetermined portion inside each of the first well regions 30 on the surface of the drift layer 20 is opened. Then, n-type impurities such as nitrogen (N) are ion implanted. The depth of the ion-implanted N is less than the thickness of the first well regions 30. The impurity concentration of the ion-implanted N ranges from $1\times10^{18}$ to $1\times10^{21}$ cm', which exceeds the p-type impurity concentration of the first well regions 30. N-type regions in the regions where N has been implanted in this process become the source regions 40.

Next, a thermal processing device performs annealing in an inert gas atmosphere such as argon (Ar) at a temperature from 1300 to 1900° C. for 30 seconds to 1 hour. This annealing electrically activates the ion implanted N and Al.

Then, the field insulating film 51 made of silicon oxide and having a thickness from 0.5 to 2 μm is formed by, for example, CVD or a photolithography technique on the semiconductor layer in a region other the active region which substantially corresponds to a region where the first well regions 30 are formed.

Next, the surface of silicon carbide that is not covered with the field insulating film 51 is thermally oxidized to form a silicon oxide film as the gate insulating film 50 with a predetermined thickness. Then, a polycrystalline silicon film having conductivity is formed by low pressure CVD on the gate insulating film 50 and the field insulating film 51, and is patterned to form the gate electrode 60. Next, the interlayer insulating film 55 made of silicon oxide is formed by low pressure CVD. Then, the first contact hole 90 is formed through the interlayer insulating film 55 and the gate insulating film 50 to reach the contact regions 32 and the source regions 40 in the active region. At the same time, the second contact hole 91 is formed to reach the second well region 31.

Next, a metal film mainly containing Ni is formed by, for example, sputtering. Then, the metal film is subjected to a thermal process at a temperature from 600 to 1100° C. so that the metal film mainly containing Ni reacts with a silicon carbide layer in the first contact hole 90, thereby forming a silicide between the silicon carbide layer and the metal film. Next, the residual metal film other than the silicide resulting from the reaction is removed by wet etching. Consequently, the ohmic electrodes 70 are formed.

Then, a metal film mainly containing Ni is formed on the rear surface (second main surface) of the semiconductor substrate 10 and thermally processed, thereby forming a rear surface ohmic electrode (not illustrated) on the rear side of the semiconductor substrate 10.

Next, portions of the interlayer insulating film 55 on the first separation regions 21, and portions of the interlayer insulating film 55 at positions where the gate insulating film 50 and the gate contact holes 95 are to be formed are removed by patterning using, for example, a photoresist. The removing method is wet-etching that does not damage the surface of the silicon carbide layer to be the Schottky interface.

Then, a metal film to be formed into Schottky electrodes is deposited by, for example, sputtering. Then, the first Schottky electrodes 71 are formed on the first separation regions 21 in the first contact hole 90 by patterning using, for example, a photoresist.

Next, a wiring metal made of, for example, Al is formed by sputtering or vapor deposition on the surface of the substrate that is being processed so far, and is processed into a predetermined shape by a photolithographic technique to form the source electrode 80 in contact with the ohmic electrodes 70, the first Schottky electrodes 71, and the second well region 31 for the source and form the gate pad 81 and the gate line 82 that are in contact with the gate electrode 60.

Further, the drain electrode 84 is formed as a metal film on the surface of the rear surface ohmic electrode (not illustrated) formed on the rear surface of the substrate, thus completing the fabrication of the silicon carbide semiconductor device according to Embodiment 1 that is illustrated in FIGS. 1 to 3.

Next, operations of the SiC-MOSFET with built-in SBDs as the silicon carbide semiconductor device according to Embodiment 1 will be described. Here, an example silicon carbide semiconductor device made of 4H-type silicon carbide as a semiconductor material will be described. In this case, a diffusion potential at a p-n junction is approximately 2 V.

First, free-wheeling operations will be described.

A voltage of several volts is generated in the free-wheeling operations, as a drain voltage (a voltage at the drain electrode 84) is lower than a source voltage (a voltage at the source electrode 80). In the presence of the source electrode 80 having an ohmic connection to the second well region 31 through the ohmic electrodes 70, much of the voltage between the source and the drain is applied to the p-n junction formed between the second well region 31 and the drift layer 20, thereby causing a bipolar current to flow through the p-n diode formed by the second well region 31 and the drift layer 20.

However, the second well region 31 does not have an ohmic connection to the source electrode 80 in the silicon carbide semiconductor device according to the present invention. Thus, majority carriers are not implanted into the second well region 31 during the free-wheeling operations. Consequently, the bipolar current that is a forward current does not flow through the p-n junction between the second well region 31 and the drift layer 20. Thus, the expansion of the stacking faults in the p-n junction and reduction in the breakdown voltage due to this expansion of the stacking faults can be suppressed.

In the silicon carbide semiconductor device according to Embodiment 1, the voltage caused by excess charges generated in the second well region 31 in turn-on is applied between the gate electrode 60 and the second well region 31. This voltage is shared between the gate insulating film 50 and the depletion layer formed in the field limiting layer 33.

This depletion layer is formed in the second well region 31 even when the field limiting layer 33 is not formed. Since the field limiting layer 33 lower in impurity concentration than the second well region 31 is formed below the gate electrode 60 in the silicon carbide semiconductor device according to Embodiment 1, the width of this depletion layer is significantly larger than that when the field limiting layer 33 is not formed. Thus, since the depletion layer in this field limiting layer 33 can deal with much of the voltage generated from the excess charges in the second well region 31 in turn-on, the voltage to be applied to the gate insulating film 50 can be significantly reduced. Thus, the reliability of the gate insulating film 50 can be significantly enhanced.

Consequently, bipolar operations in the terminal region can be suppressed in the silicon carbide semiconductor device according to Embodiment 1. Moreover, the voltage generated in the gate insulating film 50 formed on the second well region 31 in the turn-on operations can be reduced, and dielectric breakdown in the gate insulating film can be suppressed.

Figure 4:
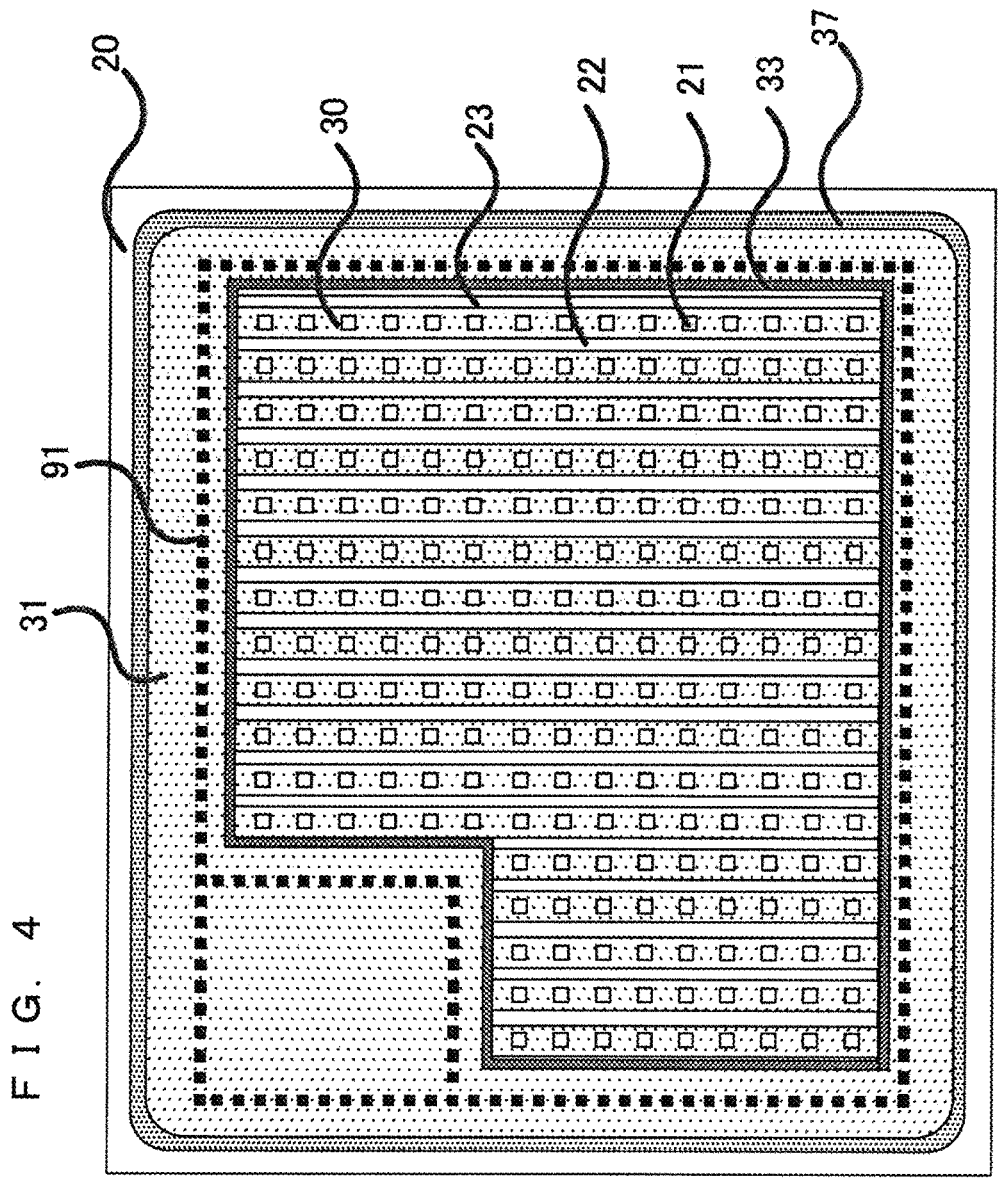
FIG. 4 is a schematic plan view of a silicon carbide semiconductor device with another structure according to Embodiment 1 of this invention.

Although Embodiment 1 describes that the first well regions 30 are separated from the second well region 31, the first well regions 30 may be connected to the second well region 31. Furthermore, although described is the plurality of first well regions 30 that are separated from each other, the first well regions 30 may be connected to each other. FIG. 4 is a schematic plan view when the first well regions 30 are connected to the second well region 31 and the first well regions 30 are connected to each other. Here, each of the first well regions 30 is at a distance of 50 µm or less either from the source region 40 in the first well region 30 or from the first Schottky electrode 71 formed on the first separation region 21 in the first well region 30.

Figure 5:
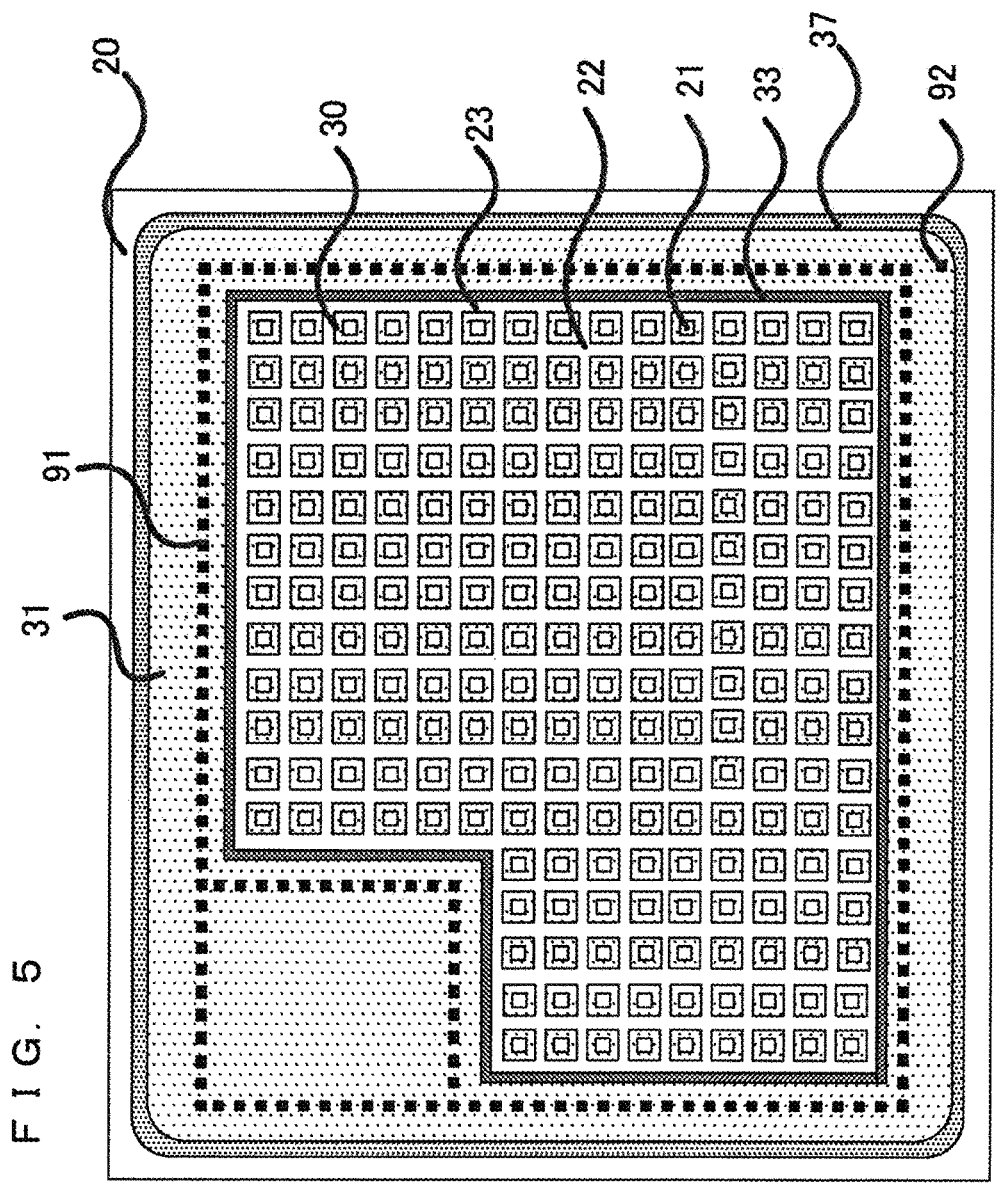
FIG. 5 is a schematic plan view of a silicon carbide semiconductor device with another structure according to Embodiment 1 of this invention.
Figure 6:
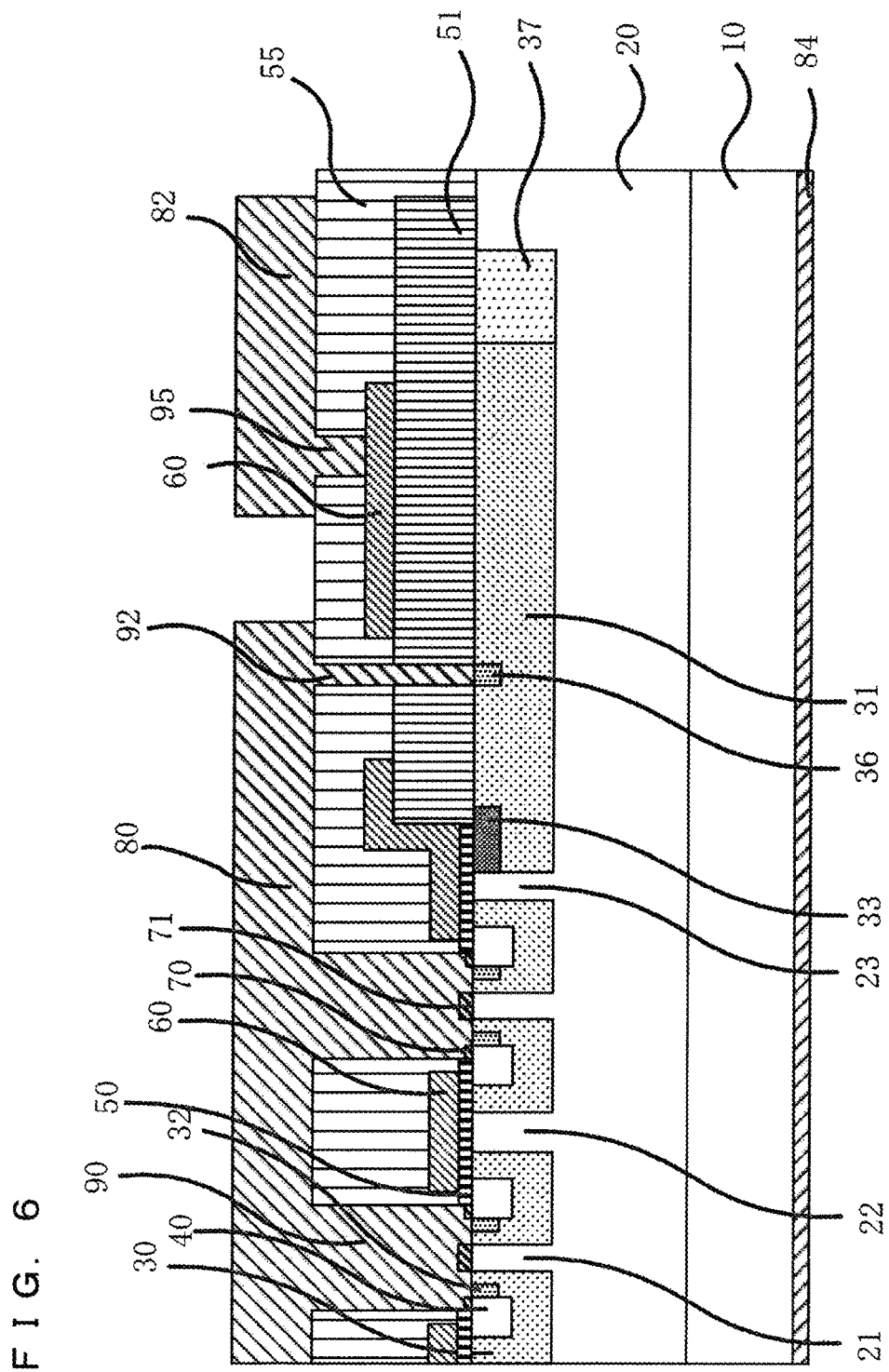
FIG. 6 is a schematic sectional view of the silicon carbide semiconductor device with another structure according to Embodiment 1 of this invention.

FIG. 5 is a schematic plan view mainly illustrating a silicon carbide semiconductor portion in a silicon carbide semiconductor device with another feature according to Embodiment 1. In FIG. 5, a second-well-region contact hole 92 having an ohmic connection to the second well region 31 and the source electrode 80 is formed on a portion of the second well region 31. FIG. 6 is a schematic sectional view illustrating a cross section including the portion in which the second-well-region contact hole 92 in FIG. 5 is formed. In FIG. 6, the second-well-region contact hole 92 is formed through the field insulating film 51 and the interlayer insulating film 55. The second well region 31 under the second-well-region contact hole 92 may include a second well contact region 36 higher in p-type impurity concentration and lower in resistance than the second well region 31.

The second-well-region contact hole 92 is formed on the shortest path in the second well region 31 at a distance of 10 µm or more from the second contact hole 91 in the cross-lateral direction. Here, a portion in the second well region 31 at a distance of 10 µm or more from the second-well-region contact hole 92 is regarded as having substantially a non-ohmic connection. More preferably, the distance between the second contact hole 91 and the second-well-region contact hole 92 on the shortest path in the second well region 31 should be 50 µm or more.

Although the ion implantation is performed in a predetermined order in the examples described in Embodiment 1, the order of the ion implantation may be changed where appropriate. Further, the field limiting layer 33 may be formed by counter-doping n-type ions in the surface layer area of the second well region 31 after p-type ions for forming the second well region 31 are implanted. In addition, the order of forming the ohmic electrode on the rear surface, and the ohmic electrodes 70 and the first Schottky electrodes 71 on the front surface may be changed where appropriate.

Although the first Schottky electrodes 71 are formed only on the first separation regions 21 and the first well regions 30 in the examples described in Embodiment 1, they may be formed on the ohmic electrodes 70 and the interlayer insulating film 55.

Although Embodiment 1 is described based on the planar type in which the channel region and the Schottky electrode surface are formed parallel to the wafer plane, Embodiment 1 is also applicable to the trench type in which the channel region or the Schottky electrode surface is formed diagonal or vertical to the wafer plane. Here, the surfaces defined in this DESCRIPTION include not only the wafer plane but also the surface on which a trench is formed.

Although the first separation regions 21 are of n-type similarly to the drift layer 20 and have the same impurity concentration as that of the drift layer 20 according to Embodiment 1, the first separation regions 21 may be higher in n-type impurity concentration than the drift layer 20. These details on the first separation regions 21 also apply to the second separation regions 22 and the third separation region 23.

Although described is that the first conductivity type and the second conductivity type are n-type and p-type, respectively, and that they may be reversed, handling the first conductivity type as n-type and the second conductivity type as p-type produces more advantages.

Figure 7:
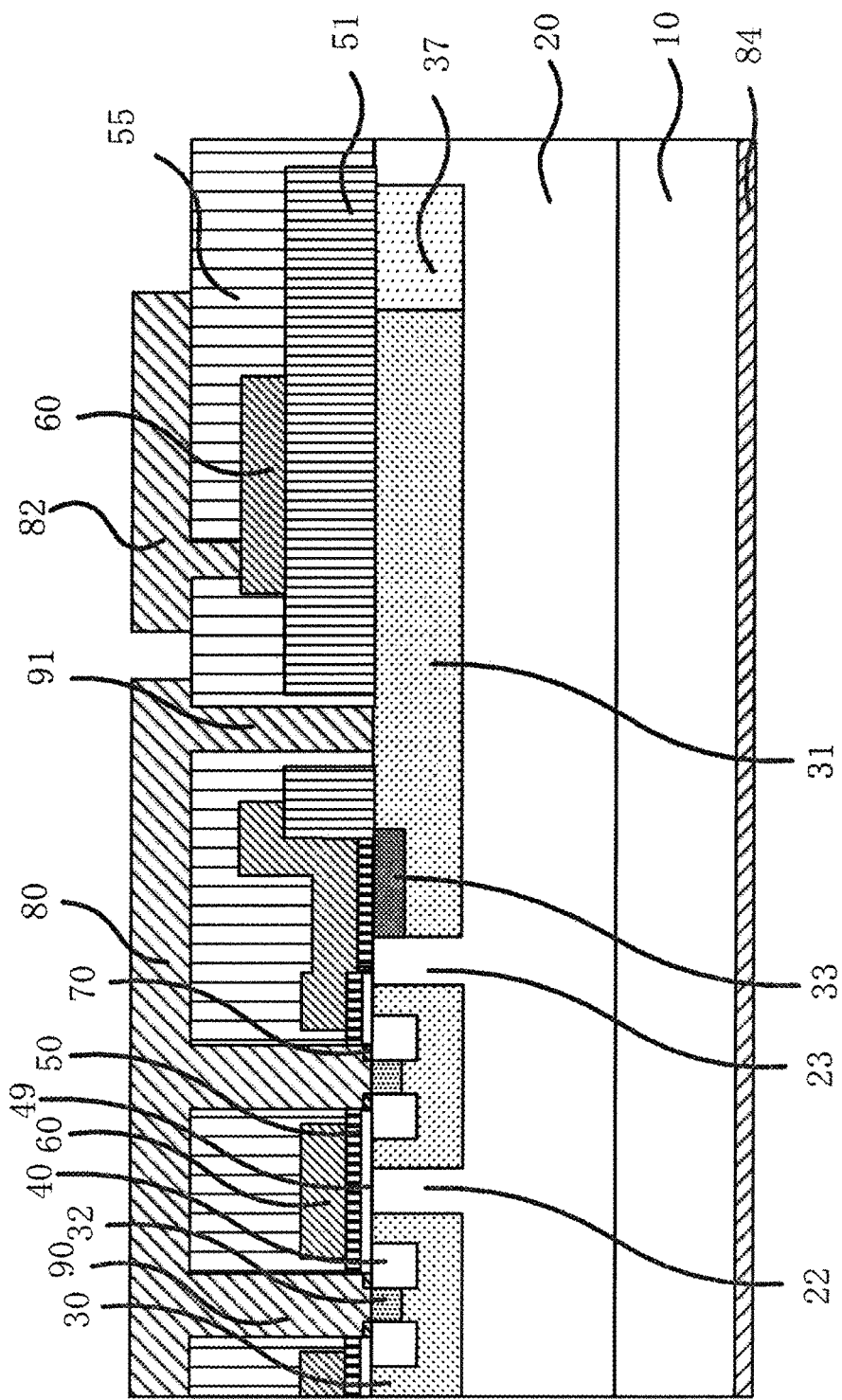
FIG. 7 is a schematic sectional view of a silicon carbide semiconductor device according to Embodiment 1 of this invention.

Although Embodiment 1 describes an example in the presence of a MOSFET with built-in SBDs in the active region, the MOSFET with built-in SBDs may be replaced with a MOSFET including an n-type channel epitaxial layer 49 on p-type well regions. This MOSFET may be designed so that the channel epitaxial layer 49 functions as unipolar diodes with a gate voltage lower than or equal to a threshold voltage and a turn-on voltage of the unipolar diodes is lower than an operating voltage of a p-n diode formed by the p-type well regions and an n-type drift layer. FIG. 7 is a schematic sectional view of such a MOSFET that replaces the MOSFET with built-in SBDs in FIG. 2. Consequently, application of a reverse current to a channel region in the MOSFET during the free-wheeling operations can produce the same advantages as those of the MOSFET with built-in SBDs.

Embodiment 2

Figure 8:
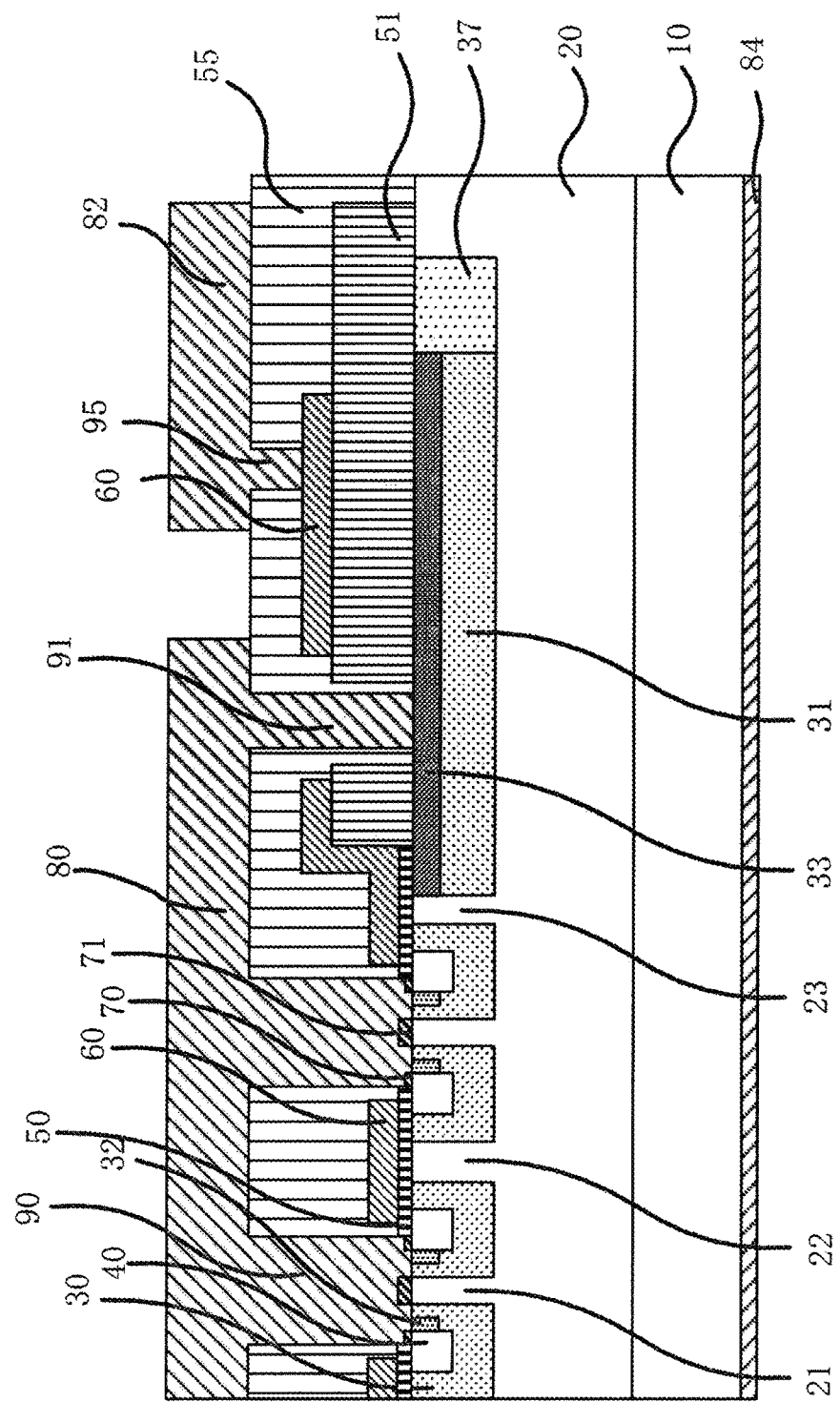
FIG. 8 is a schematic sectional view of a silicon carbide semiconductor device according to Embodiment 2 of this invention.

The terminal region of the silicon carbide semiconductor device according to Embodiment 1 includes the field limiting layer 33 in the surface layer area of the second well region 31 below a portion including the gate electrode 60. In Embodiment 2, the field limiting layer 33 is formed over the entire second well region 31 as FIG. 8 illustrates the schematic sectional view. In other words, the field limiting layer 33 is formed in an upper layer area of the second well region 31 above which the gate electrode 60 is formed through the field insulating film 51 and the gate pad 81 is formed through the field insulating film 51 and the interlayer insulating film 55.

A method for manufacturing the silicon carbide semiconductor device according to Embodiment 2 is identical to that according to Embodiment 1. The field limiting layer 33 should be formed over the entire second well region 31 by merely changing the mask pattern.

Figure 9:
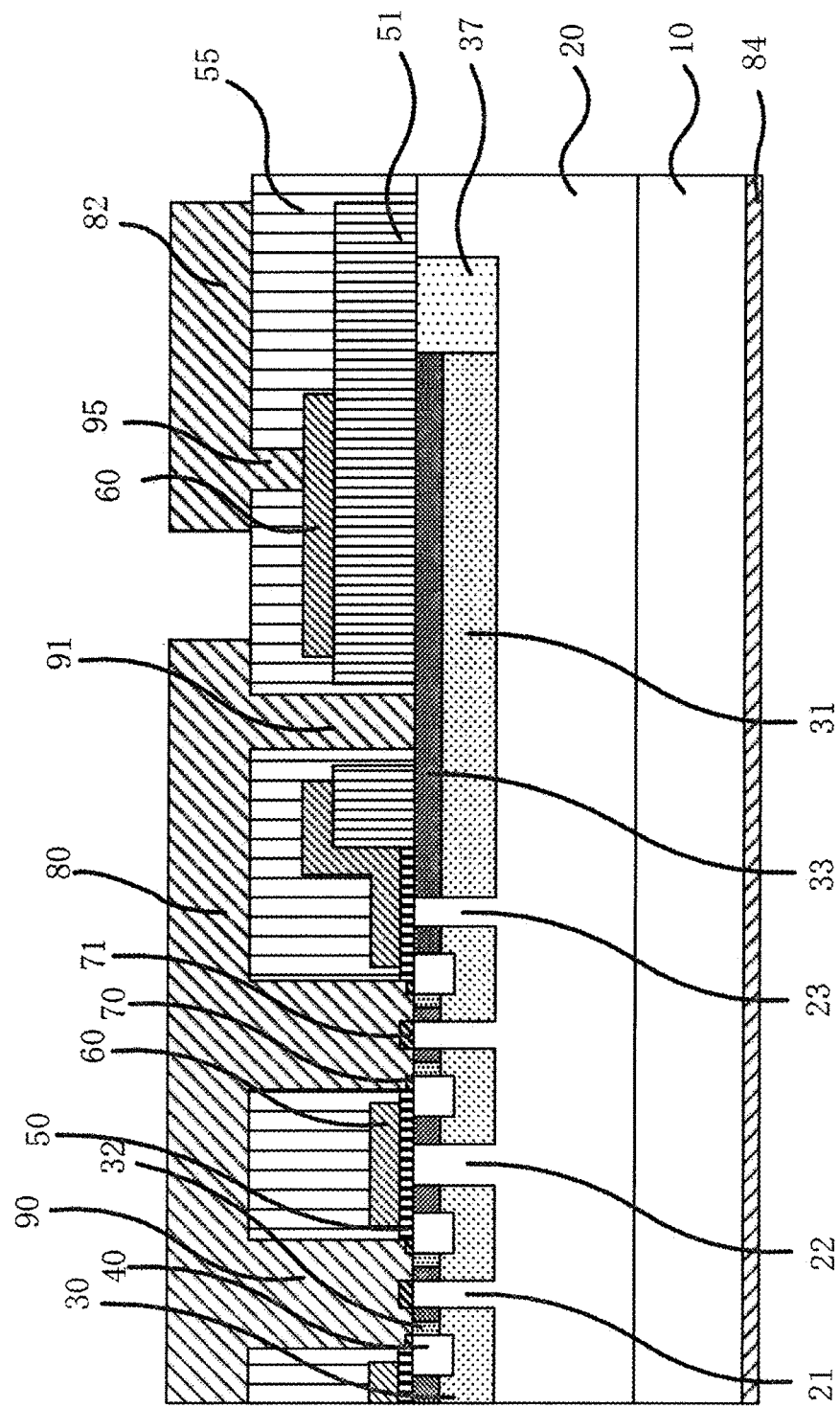
FIG. 9 is a schematic sectional view of a silicon carbide semiconductor device according to Embodiment 2 of this invention.

The silicon carbide semiconductor device according to Embodiment 2 can produce the advantages described in Embodiment 1, specifically, reducing, in turn-on, not only the voltage to be applied to the gate insulating film 50 formed between the second well region 31 and the gate electrode 60 but also the voltages to be applied to the field insulating film 51 formed between the second well region 31 and the gate electrode 60 and to the field insulating film 51 and the interlayer insulating film 55 formed between the second well region 31 and the gate pad 81. Thus, the reliability of the field insulating film 51 and the interlayer insulating film 55 can be significantly enhanced. The first well regions 30 may be formed simultaneously with an impurity concentration distribution in the same depth direction as that of the second well region 31 over the entire which the field limiting layer 33 is formed. FIG. 9 is a schematic sectional view of the field limiting layer 33 formed over the entirety of the first well regions 30 and the second well region 31. This structure can simultaneously form the entirety of the first well regions 30 and the second well region 31 through ion implantation, and simplify the manufacturing processes.

Embodiment 3

Figure 10:
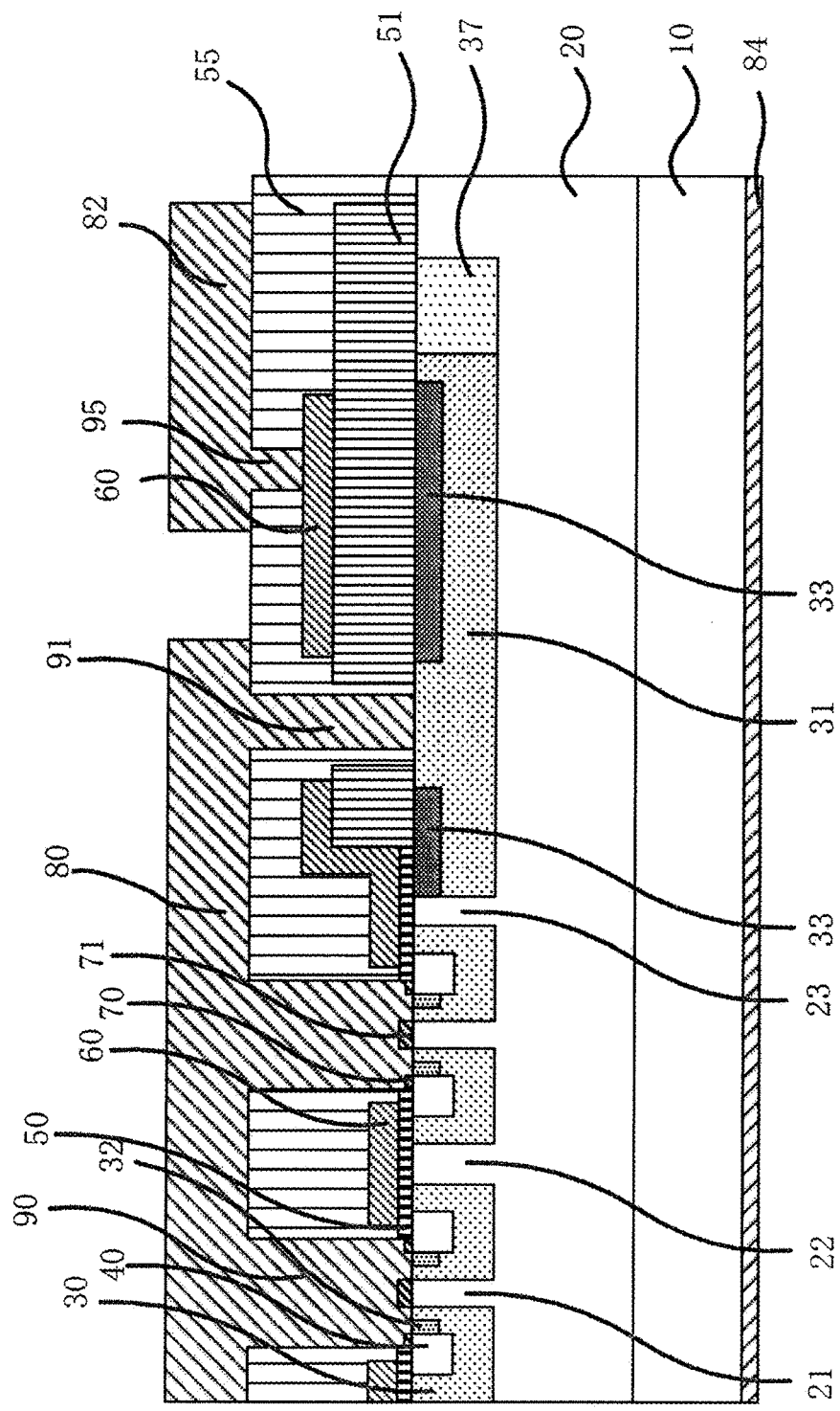
FIG. 10 is a schematic sectional view of a silicon carbide semiconductor device according to Embodiment 3 of this invention.

In a silicon carbide semiconductor device according to Embodiment 3 whose schematic sectional view is illustrated in FIG. 10, the field limiting layer 33 is formed in any plane region in which at least both of the second well region 31 and the gate electrode 60 are formed, though the field limiting layer 33 is not formed in a surface layer area of the second well region 31 that is in contact with the source electrode 80. The field limiting layer 33 may be formed in a plane region in which the gate electrode 60 is not formed. Since the other features are the same as those according to Embodiment 2, the detailed description will be omitted.

In the silicon carbide semiconductor device according to Embodiment 3, the voltage generated in turn-on between the second well region 31 and the gate electrode 60 is shared between the depletion layer formed in the field limiting layer 33 and the gate insulating film 50 or the field insulating film 51 in all the regions sandwiched between the second well region 31 and the gate electrode 60. This can prevent a high voltage from being applied to the gate insulating film 50 or the field insulating film 51, and enhance the reliability of the semiconductor device. Further, when the second well region 31 and the first well regions 30 are simultaneously formed through the same processes, the surface layer of the first well regions 30 can have an arbitrary impurity concentration different from that of the field limiting layer 33, for example, by increasing the acceptor concentration. Thus, the MOSFET formed in the first well regions 30 in the active region may be set to a threshold voltage at which a malfunction hardly occurs.

Embodiment 4

In the terminal region of the silicon carbide semiconductor device according to Embodiment 1, the second well region 31 has a non-ohmic connection to the source electrode 80 without having an ohmic contact thereto. Besides, a separation region of the first conductivity type may be formed inside the second well region 31 in the plane direction similarly to that in the first well regions 30 in the active region, and an electrode that forms a Schottky connection with the separation region may be formed. Since the other features are the same as those according to Embodiment 1, the detailed description will be omitted.

Figure 11:
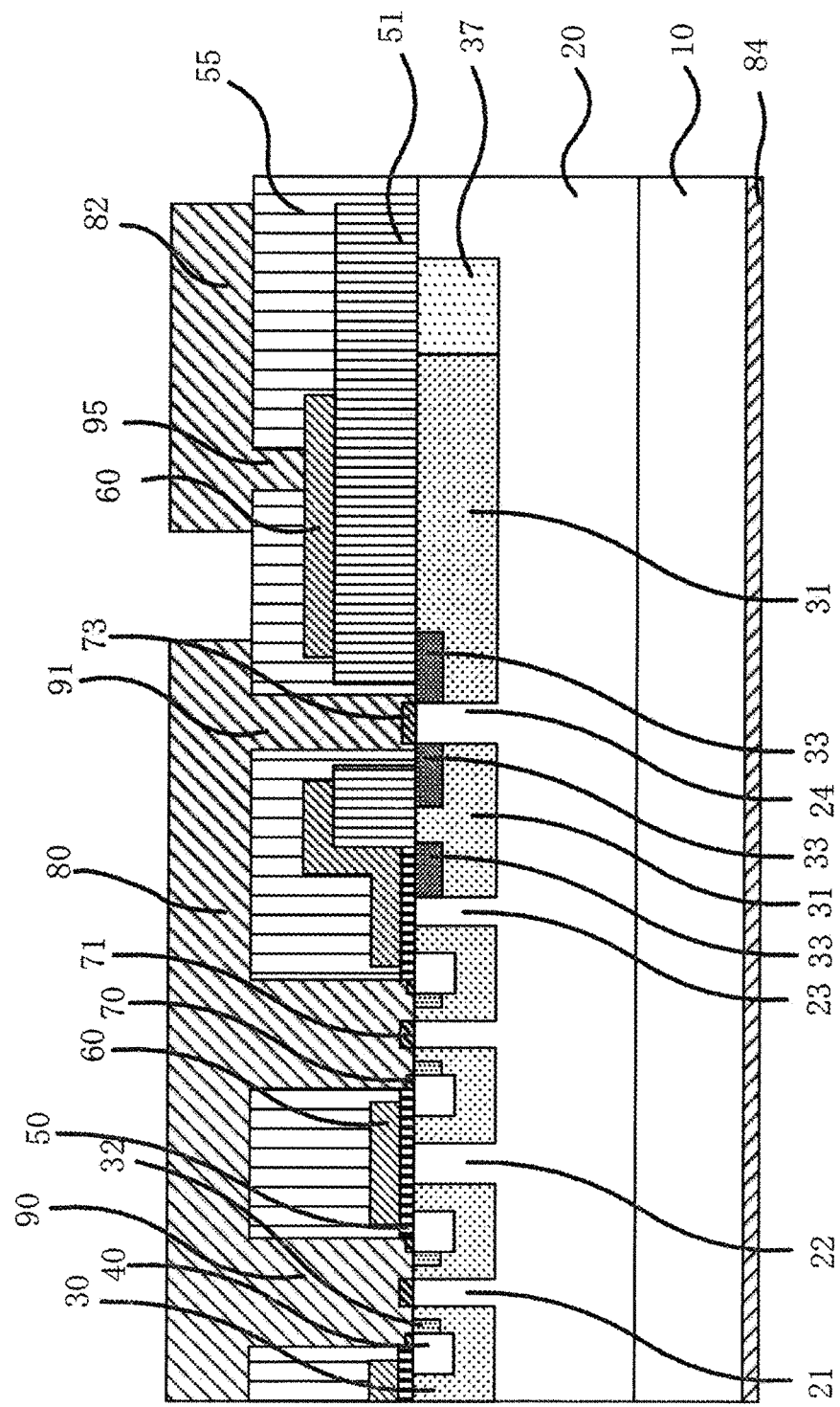
FIG. 11 is a schematic sectional view of a silicon carbide semiconductor device according to Embodiment 4 of this invention.

FIG. 11 is a schematic sectional view of a silicon carbide semiconductor device according to Embodiment 4 schematically illustrating a cross section corresponding to the line a-a' from the source electrode 80 to the gate line 82 on the periphery of the silicon carbide semiconductor device described with reference to FIG. 1 according to Embodiment 1.

A fourth separation region 24 of the first conductivity type that is made of silicon carbide is formed inside a plane of the second well region 31 of the second conductivity type in the terminal region of FIG. 11. A second Schottky electrode 73 that forms a Schottky connection with the fourth separation region 24 is formed on the fourth separation region 24. The field limiting layer 33 is formed in the surface layer area of the second well region 31 around the fourth separation region 24. The source electrode 80 is formed in the second contact hole 91 formed on the fourth separation region 24 and the field limiting layer 33. The other features are the same as those according to Embodiment 1.

Since the silicon carbide semiconductor device according to Embodiment 4 has a structure for forming a Schottky connection with the drift layer 20 inside the plane of the second well region 31 similarly to that in the active region, the bipolar current flowing through the second well region 31 that is a termination structure can be further reduced.

Embodiment 5

Figure 12:
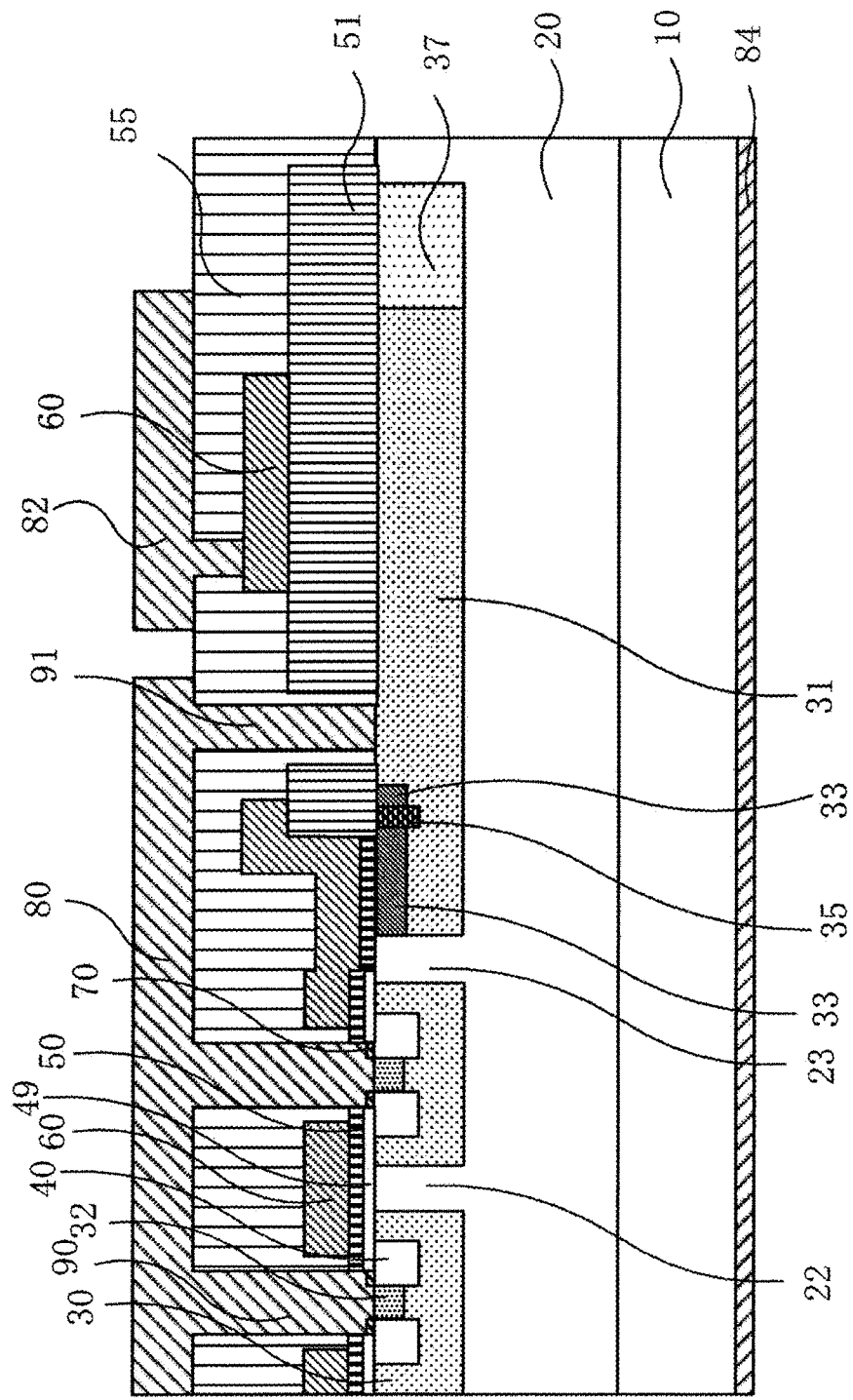
FIG. 12 is a schematic sectional view of a silicon carbide semiconductor device according to Embodiment 5 of this invention.

As FIG. 12 illustrates the schematic sectional view, a silicon carbide semiconductor device according to Embodiment 5 includes a parasitic channel stopper region 35 of the second conductivity type in a region between the second contact hole 91 and the third separation region 23, in a region in which the field limiting layer 33 is formed in the surface layer area of the second well region 31. Since the other features are the same as those according to Embodiments 1 to 3, the detailed description will be omitted.

Although the parasitic channel stopper region 35 is formed in the field limiting layer 33 on the shortest path for connecting at least the second contact hole 91 to the third separation region 23, the parasitic channel stopper region 35 may be formed on the other paths. Further, the parasitic channel stopper region 35 is of the second conductivity type, and is higher in impurity concentration of the second conductivity type than the field limiting layer 33 and the second well region 31.

The parasitic channel stopper region 35 may be formed in a region surrounded by the field limiting layer 33.

Next, a method for manufacturing the silicon carbide semiconductor device according to Embodiment 5 will be described. The silicon carbide semiconductor device according to Embodiment 5 is manufactured in the same manner as the silicon carbide semiconductor device according to Embodiment 1, and can be manufactured by adding processes for forming an implantation mask for forming the parasitic channel stopper region 35, implanting ions, and removing the implantation mask. Without adding the new processes, the parasitic channel stopper region 35 may be formed simultaneously when the contact regions 32 are formed. Here, the parasitic channel stopper region 35 has the same impurity concentration as that of the contact regions 32, and can be manufactured without increasing the manufacturing cost through adding the manufacturing processes.

Next, the advantages of the silicon carbide semiconductor device according to Embodiment 5 will be described.

In a silicon carbide semiconductor device in which the parasitic channel stopper region 35 is not formed unlike the silicon carbide semiconductor device according to Embodiment 5, a region in which the field limiting layer 33 lower in impurity concentration than the second well region 31 is formed may include a parasitic n-type channel in a surface layer of the field limiting layer 33 and a leakage path connecting from the drain electrode 84 to the source electrode 80 through the third separation region 23, the parasitic n-type channel, and the second contact hole 91 in an OFF state, that is, when no positive voltage (a voltage for causing a current to flow through a MOSFET) is applied to the gate electrode. This may result in increase in the leakage current or a failure of maintaining the breakdown voltage in the silicon carbide semiconductor device. This phenomenon more easily occurs when the second well region 31 does not have an ohmic connection to the source electrode 80.

Particularly, when the displacement current flows through the second well region 31 through the p-n junction formed between the second well region 31 and the drift layer 20 in turn-off switching, if the potential of the second well region 31 having a non-ohmic connection to the source electrode 80 increases and the potential for electrons in the second well region 31 decreases, the leakage path is easily formed.

In contrast, since the parasitic channel stopper region 35 higher in impurity concentration than the field limiting layer 33 and the second well region 31 is formed in a part of the field limiting layer 33 between the second contact hole 91 and the third separation region 23 in the silicon carbide semiconductor device according to Embodiment 5, the parasitic n-type channel is interrupted by the parasitic channel stopper region 35 and occurrence of the leakage current is suppressed. Thus, even when the potential of the second well region 31 increases in turn-off switching, occurrence of the leakage current can be suppressed, and a more reliable silicon carbide semiconductor device can be implemented.

If the parasitic channel stopper region 35 is formed in a region above which the gate electrode 60 is not formed through the gate insulating film 50, the insulating film between the parasitic channel stopper region 35 and the gate electrode 60 is not subjected to a high electric field, which enhances the reliability more significantly.

Embodiment 6

Embodiments 1 to 5 mainly describe, in principle in the terminal region of the silicon carbide semiconductor device, that the second well region 31 with the termination structure is separated from the first well regions 30 in the active region and that the second well region 31 has a non-ohmic connection to the source electrode 80. In Embodiment 6, the second well region 31 with the termination structure is partly connected to the first well regions 30 through auxiliary connection regions 34. Since the other structures are the same as those according to Embodiments 1 to 5, the detailed description will be omitted.

Figure 13:
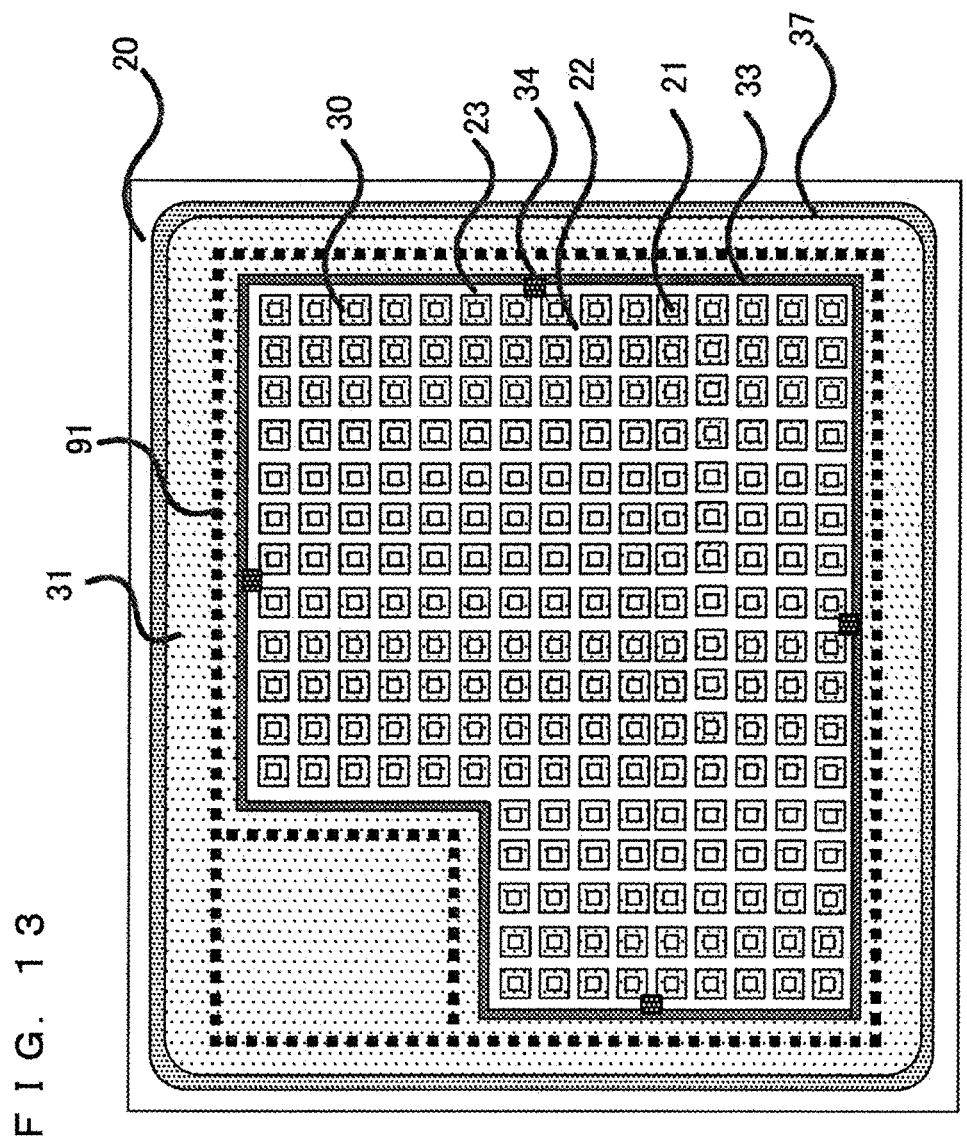
FIG. 13 is a schematic plan view of a silicon carbide semiconductor device according to Embodiment 6 of this invention.

FIG. 13 is a schematic plan view of a silicon carbide semiconductor device according to Embodiment 6. In FIG. 13, the first well regions 30 in the active region are connected to the second well region 31 in the terminal region through the auxiliary connection regions 34 of the second conductivity type. FIG. 13 is a drawing applied to Embodiment 1.

The auxiliary connection regions 34 of the second conductivity type should be formed simultaneously with the second well region 31 by changing the ion implantation mask.

When the first well regions 30 in the active region are completely separated from the second well region 31 with the termination structure and the second well region 31 is completely in a floating state, the second well region 31 may be charged up depending on a condition or a structure, which may cause dielectric breakdown in the insulating film on the second well region 31.

Since the second well region 31 is connected through the auxiliary connection regions 34 in the silicon carbide semiconductor device according to Embodiment 6, suppression of the dielectric breakdown in the insulating film on the second well region 31 can more reliably occur, which can more significantly enhance the reliability.

Here, regions near the auxiliary connection regions 34 each located in the vicinity of the center of one side of the silicon carbide semiconductor device in FIG. 13 may be subjected to dielectric degradation due to the passage of a current through the auxiliary connection regions 34 without through the third separation region 23. In contrast, a current flows through the second well region 31 in a plane lateral direction for a long time, in regions near the auxiliary connection regions 34 that are located in the vicinity of the corners of the silicon carbide semiconductor device in FIG. 13 as described in Embodiment 1. Then, the voltage drop caused by a sheet resistance in the second well region 31 occurs, so that the passage of the bipolar current is suppressed.

Although the first well regions 30 are connected to the second well region 31 in many points in the structure of FIG. 4 according to Embodiment 1, the number of connections between the first well regions 30 and the second well region 31 is limited according to Embodiment 6. Thus, the number of points that may be subjected to dielectric degradation is reduced. This will restrict the dielectric degradation caused by the passage of the bipolar current through the second well region 31.

In the silicon carbide semiconductor device according to Embodiment 6, the possibility of dielectric breakdown occurring when the second well region 31 is in a floating state can be reduced, and reduction in the reliability due to the passage of the bipolar current through the second well region 31 can be minimized.

The regions where the auxiliary connection regions 34 are formed should be shorter than the region where the third separation region 23 is formed, for example, less than or equal to $1/10$ of the length of the region where the third separation region 23 is formed. Consequently, the possibility of dielectric degradation can be reduced to approximately less than or equal to $1/10$, which can significantly enhance the reliability of the elements.

Although n-type (the first conductivity type) impurities are N, they may be phosphorus or arsenic. Although p-type (the second conductivity type) impurities are Al, they may be boron or gallium.

In the MOSFETs described in Embodiments 1 to 6, the gate insulating film 50 is not necessarily an oxide film made of silicon oxide, but may be an insulating film other than an oxide film or a combination of an insulating film other than an oxide film and an oxide film. Although silicon oxide resulting from thermal oxidation of silicon carbide is used for forming the gate insulating film 50, a deposited film formed by CVD using silicon oxide may be used. Further, the present invention is also applicable to a MOSFET with a super junction structure.

The devices described in Embodiments above are the MOSFETs each with the gate insulating film 50. Meanwhile, the present invention is applicable to any unipolar device, for example, a junction FET (JFET) and a metal-semiconductor field effect transistor (MESFET) without the gate insulating film 50.

Although the ohmic electrodes 70 and the first Schottky electrodes 71 for the source are formed separately in Embodiments above, they may be formed continuously with the same material or different materials.

The first Schottky electrodes 71 and the second Schottky electrode 73 may be formed of the same material or different materials.

Embodiments above describe, for example, a crystal structure, a plane direction of a main surface, an off angle, and each implantation condition using the specific examples. However, the applicability should not be limited to the given numerical ranges.

Embodiment 7

Embodiment 7 will describe a power converter to which the silicon carbide semiconductor devices according to Embodiments 1 to 6 are applied. Although the present invention is not limited to specific power converters, Embodiment 7 will describe application of the present invention to a three-phase inverter.

Figure 14:
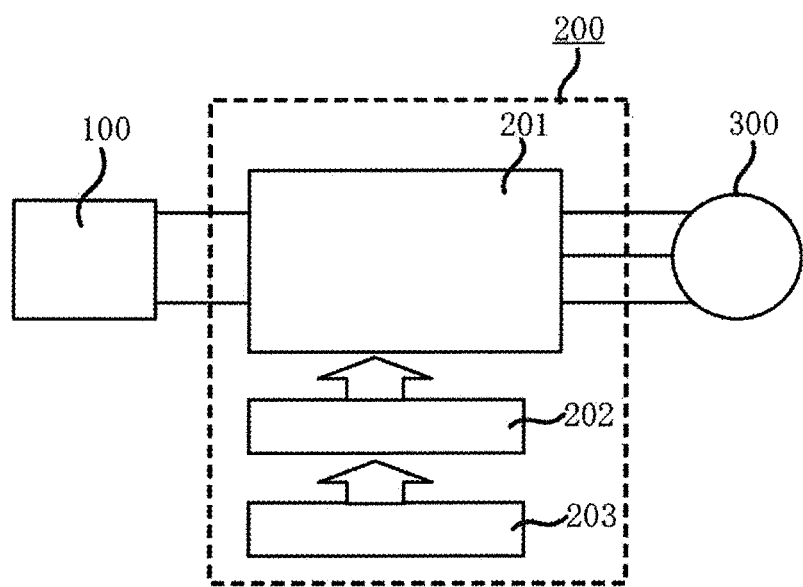
FIG. 14 is a schematic view illustrating a configuration of a power converter according to Embodiment 7 of this invention.

FIG. 14 is a block diagram illustrating a configuration of a power conversion system to which the power converter according to Embodiment 7 is applied.

The power conversion system illustrated in FIG. 14 includes a power supply 100, a power converter 200, and a load 300. The power supply 100, which is a DC power supply, supplies a DC power to the power converter 200. The power source 100 may include various types of components such as a direct current system, a solar battery, or a rechargeable battery, and may include a rectifying circuit connected to an AC system or an AC/DC converter. The power source 100 may include a DC/DC converter which converts a DC power output from a DC system into a predetermined power.

The power converter 200, which is a three-phase inverter connected between the power source 100 and the load 300, converts the DC power supplied from the power source 100 into the AC power to supply the AC power to the load 300. As illustrated in FIG. 14, the power converter 200 includes a main conversion circuit 201 which converts the DC power into the AC power, a drive circuit 202 which outputs a drive signal for driving each switching element in the main conversion circuit 201, and a control circuit 203 which outputs, to the drive circuit 202, a control signal for controlling the drive circuit 202.

The load 300 is a three-phase electrical motor driven by the AC power supplied from the power converter 200. The load 300 is not limited to specific use but is an electrical motor mounted on various types of electrical devices. Thus, the load 300 is used as an electrical motor for, for example, a hybrid car, an electrical car, a rail vehicle, an elevator, or air-conditioning equipment.

The power converter 200 will be described in detail hereinafter. The main conversion circuit 201 includes switching elements and free-wheeling diodes (not shown). Switching of the switching element causes the DC power supplied from the power supply 100 to be converted into the AC power. The AC power is then supplied to the load 300. The specific circuit configuration of the main conversion circuit 201 is of various types. The main conversion circuit 201 according to Embodiment 7 is a three-phase full-bridge circuit having two levels, and includes six switching elements and six free-wheeling diodes anti-parallel connected to the respective switching elements. The silicon carbide semiconductor device according to one of Embodiments 1 to 6 is applied to each of the switching elements of the main conversion circuit 201. The six switching elements form three pairs of upper and lower arms in each pair of which the two switching elements are serially connected to each other. The three pairs of upper and lower arms form the respective phases (U-phase, V-phase, and W-phase) of the full-bridge circuit. Output terminals of the respective pairs of upper and lower arms, i.e., three output terminals of the main conversion circuit 201 are connected to the load 300.

The drive circuit 202 generates drive signals for driving the switching elements of the main conversion circuit 201, and supplies the drive signals to control electrodes of the switching elements of the main conversion circuit 201. Specifically, the drive circuit 202 outputs, to the control electrodes of the switching elements in accordance with the control signal from the control circuit 203 to be described later, the drive signal for switching the switching element to an ON state and the drive signal for switching the switching element to an OFF state. The drive signal is a voltage signal (ON signal) equal to or higher than a threshold voltage of the switching element when the switching element is kept in the ON state. The drive signal is a voltage signal (OFF signal) equal to or lower than the threshold voltage of the switching element when the switching element is kept in the OFF state.

The control circuit 203 controls the switching elements of the main conversion circuit 201 so that a desired power is supplied to the load 300. Specifically, the control circuit 203 calculates a time (ON time) when each of the switching elements of the main conversion circuit 201 should enter the ON state, based on the power to be supplied to the load 300. For example, the main conversion circuit 201 can be controlled by performing PWM control for modulating the ON time of the switching elements in accordance with the voltage to be output. Then, the control circuit 203 outputs a control instruction (control signal) to the drive circuit 202 so that the drive circuit 202 outputs the ON signal to the switching element which should enter the ON state and outputs the OFF signal to the switching element which should enter the OFF state at each time. The drive circuit 202 outputs the ON signal or the OFF signal as the drive signal to the control electrode of each of the switching elements in accordance with this control signal.

Since the silicon carbide semiconductor devices according to Embodiments 1 to 6 are applied to the power converter according to Embodiment 7 as the switching elements of the main conversion circuit 201, a low-loss power converter that performs more reliable high-speed switching can be implemented.

Although Embodiment 7 describes the example of applying the present invention to the three-phase inverter having the two levels, the present invention is not limited thereto but can be applied to the various power converters. Although Embodiment 7 describes the power converter having the two levels, the power converter may have three or multiple levels. The present invention may be applied to a single-phase inverter when the power is supplied to a single-phase load. Moreover, the present invention is also applicable to a DC/DC converter or an AC/DC converter when the power is supplied to, for example, a DC load.

The power converter to which the present invention is applied is not limited to a power converter including a motor as the load. The power converter can also be used as a power-supply device of an electrical discharge machine, a laser beam machine, an induction heat cooking device, or a non-contact power feeding system, and can be further used as a power conditioner of, for example, a solar power system or an electricity storage system.

The invention claimed is:
1. A silicon carbide semiconductor device, comprising:
a semiconductor substrate made of silicon carbide of a first conductivity type;
a drift layer of the first conductivity type, the drift layer being formed on the semiconductor substrate;
a plurality of first well regions of a second conductivity type, the first well regions being formed in a surface layer of the drift layer;
a first separation region of the first conductivity type, the first separation region being formed adjacent to each of the first well regions from a surface of the first well regions to the drift layer;
a source region of the first conductivity type, the source region being formed in a surface layer area of each of the first well regions;

a first Schottky electrode formed on the first separation region, the first Schottky electrode forming a Schottky junction with the first separation region;
an ohmic electrode formed on each of the first well regions;
a second well region of the second conductivity type, the second well region being formed in the surface layer of the drift layer separately from the first well regions;
a gate insulating film formed on the first well regions and the second well region;
a gate electrode formed on the gate insulating film on the first well regions and the second well region;
a gate pad connected to the gate electrode and formed above the second well region;
a source electrode electrically connected to the first Schottky electrode and the ohmic electrodes, the source electrode having a non-ohmic connection to the second well region; and
a field limiting layer formed in a surface layer area of the second well region that is a portion facing the gate electrode through the gate insulating film, the field limiting layer being lower in impurity concentration of the second conductivity type than the second well region.

2. The silicon carbide semiconductor device according to claim 1,
wherein the first well regions are separated from the second well region.

3. The silicon carbide semiconductor device according to claim 1,
wherein the field limiting layer is formed in an upper layer area of the entire second well region.

4. The silicon carbide semiconductor device according to claim 3,
wherein the second well region including the field limiting layer is identical in second impurity concentration profile to the first well regions.

5. The silicon carbide semiconductor device according to claim 1,
wherein the field limiting layer is formed in an upper layer area of the second well region, the upper layer area being an entire region facing a region on which the gate electrode is formed.

6. The silicon carbide semiconductor device according to claim 1, comprising:
a fourth separation region of the first conductivity type, the fourth separation region being formed inside the second well region in a plane direction; and
a second Schottky electrode formed on the fourth separation region across the fourth separation region and the field limiting layer.

7. The silicon carbide semiconductor device according to claim 1, comprising:
a contact hole for forming the non-ohmic connection between the second well region and the source electrode;
a third separation region between the first well regions and the second well region; and
a channel stopper region of the second conductivity type that is formed in a region between the contact hole and the third separation region in which the field limiting layer is formed, the channel stopper region being higher in impurity concentration of the second conductivity type than the second well region and the field limiting layer.

8. The silicon carbide semiconductor device according to claim 7, further comprising:
a contact region of the second conductivity type that is formed in contact with the ohmic electrode in the surface layer area of each of the first well regions, the contact region being higher in impurity concentration of the second conductivity type than the first well regions,
wherein the contact region is identical in impurity concentration of the second conductivity type to the channel stopper region.

9. A power converter, comprising:
a main conversion circuit including the silicon carbide semiconductor device according to claim 1, and converting an input power to output a resulting power;
a drive circuit outputting, to the silicon carbide semiconductor device, a drive signal for driving the silicon carbide semiconductor device; and
a control circuit outputting, to the drive circuit, a control signal for controlling the drive circuit.

10. A silicon carbide semiconductor device, comprising:
a semiconductor substrate made of silicon carbide of a first conductivity type;
a drift layer of the first conductivity type, the drift layer being formed on the semiconductor substrate;
a plurality of first well regions of a second conductivity type, the first well regions being formed in a surface layer of the drift layer;
a source region of the first conductivity type, the source region being formed in a surface layer area of each of the first well regions;
a channel epitaxial layer of the first conductivity type, the channel epitaxial layer being formed at least on a surface of the first well regions;
an ohmic electrode formed on each of the first well regions;
a second well region of the second conductivity type, the second well region being formed in the surface layer of the drift layer separately from the first well regions;
a gate insulating film formed on the first well regions and the second well region;
a gate electrode formed on the gate insulating film on the first well regions and the second well region;
a gate pad connected to the gate electrode and formed above the second well region;
a source electrode electrically connected to the ohmic electrodes, the source electrode having a non-ohmic connection to the second well region; and
a field limiting layer formed in a surface layer area of the second well region that is a portion facing the gate electrode through the gate insulating film, the field limiting layer being lower in impurity concentration of the second conductivity type than the second well region.

11. The silicon carbide semiconductor device according to claim 10,
wherein the first well regions are separated from the second well region.

12. The silicon carbide semiconductor device according to claim 10,
wherein the field limiting layer is formed in an upper layer area of the entire second well region.

13. The silicon carbide semiconductor device according to claim 12,
wherein the second well region including the field limiting layer is identical in second impurity concentration profile to the first well regions.

14. The silicon carbide semiconductor device according to claim 10, wherein the field limiting layer is formed in an upper layer area of the second well region, the upper layer area being an entire region facing a region on which the gate electrode is formed.

15. The silicon carbide semiconductor device according to claim 10, comprising:
    a fourth separation region of the first conductivity type, the fourth separation region being formed inside the second well region in a plane direction; and
    a second Schottky electrode formed on the fourth separation region across the fourth separation region and the field limiting layer.

16. The silicon carbide semiconductor device according to claim 10, comprising:
    a contact hole for forming the non-ohmic connection between the second well region and the source electrode;
    a third separation region between the first well regions and the second well region; and
    a channel stopper region of the second conductivity type that is formed in a region between the contact hole and the third separation region in which the field limiting layer is formed, the channel stopper region being higher in impurity concentration of the second conductivity type than the second well region and the field limiting layer.

17. The silicon carbide semiconductor device according to claim 15, further comprising:
    a contact region of the second conductivity type that is formed in contact with the ohmic electrode in the surface layer area of each of the first well regions, the contact region being higher in impurity concentration of the second conductivity type than the first well regions,
    wherein the contact region is identical in impurity concentration of the second conductivity type to the channel stopper region.

18. A power converter, comprising:
    a main conversion circuit including the silicon carbide semiconductor device according to claim 10, and converting an input power to output a resulting power;
    a drive circuit outputting, to the silicon carbide semiconductor device, a drive signal for driving the silicon carbide semiconductor device; and
    a control circuit outputting, to the drive circuit, a control signal for controlling the drive circuit.

19. The semiconductor device according to claim 10, wherein the channel epitaxial layer is lower in impurity concentration of the first conductivity type than the source regions.

20. The semiconductor device according to claim 10, wherein the channel epitaxial layer is formed on a surface of the source regions.

21. The semiconductor device according to claim 10, wherein the channel epitaxial layer is formed on a surface of the source regions, and is lower in impurity concentration of the first conductivity type than the source regions.

* * * * *